United States Patent [19]

Auston et al.

[11] Patent Number: 4,482,863
[45] Date of Patent: Nov. 13, 1984

[54] APPARATUS AND METHOD FOR MEASURING ELECTRONIC RESPONSE OF HIGH SPEED DEVICES AND MATERIALS

[75] Inventors: David H. Auston, Mountainside, N.J.; Peter R. Smith, New York, N.Y.

[73] Assignee: AT&T Bell Laboratories, Murray Hill, N.J.

[21] Appl. No.: 292,438

[22] Filed: Aug. 14, 1981

[51] Int. Cl.³ ............................................ G01R 31/26
[52] U.S. Cl. ............................. 324/158 T; 324/158 D
[58] Field of Search ....................... 324/158 D, 158 T; 370/4; 250/227

[56] References Cited

U.S. PATENT DOCUMENTS 3,801,910 4/1974 Quinn ............................ 324/158 D
3,956,698 5/1976 Malmberg et al. ............. 324/158 D
4,122,383 10/1978 von Roos ........................ 324/158 D

OTHER PUBLICATIONS

S. M. Faris, *Applied Physics Letters*, vol. 36, No. 12, "Generation and Measurement of Ultrashort Current Pulses with Josephson Devices," Jun. 15, 1980, pp. 1005–1007.

D. B. Tuckerman, *Applied Physics Letters*, vol. 36, No. 12, "A Josephson Ultrahigh-Resolution Sampling System," Jun. 15, 1980, pp. 1008–1010.

D. H. Auston, et al., *Applied Physics Letters*, vol. 37, No. 4, "Picosecond Optoelectronic Detection, Sampling, and Correlation Measurements in Amorphous Semiconductors," Aug. 15, 1980, pp. 371–373.

*Primary Examiner*—Stewart J. Levy
*Attorney, Agent, or Firm*—Richard D. Laumann

[57] ABSTRACT

Direct measurements of electronic device and material response times are made by using high speed photoconductors as both pulse generators and sampling gates.

13 Claims, 8 Drawing Figures

APPARATUS AND METHOD FOR MEASURING ELECTRONIC RESPONSE OF HIGH SPEED DEVICES AND MATERIALS

TECHNICAL FIELD

This invention relates generally to apparatus and method for measuring response times and particularly to apparatus and method for measuring response times of electronic devices, such as GaAs field effect transistors and materials such as amorphous and high defect density semiconductors.

BACKGROUND OF THE INVENTION

With the development of modern electronics, there has been a parallel development of both method and apparatus suitable for accurately determining electronic device and material characteristics. For example, sampling oscilloscopes have been developed to the point where they can measure device response times of approximately 40 picoseconds.

However, the speed of solid state electronic devices has greatly increased in recent years and has now reached the stage where the conventional approaches, such as sampling oscilloscopes, are unable to accurately determine their response times. For example, gallium arsenide and silicon field effect transistors (FETs) with effective channel lengths of approximately 1 micron and less typically have propagation delays that are estimated to be 30 picoseconds and cannot be measured by sampling oscilloscopes. Techniques have, however, been developed which permit indirect characterization of some aspects of device operation. However, these techniques do not permit evaluation, even indirectly, of all aspects of device operation. Presently, the standard technique used to evaluate high speed electronic devices involves the construction of a ring oscillator having a number of identical devices connected in tandem. The period of oscillation divided by the number of devices then gives an estimate of the propagation delay per device. This technique provides a number that is, at best, an average for the comparison of different devices, and fails to identify the specific factors which influence device response time and which must be understood if improved devices are to be designed.

It would, of course, ideally be preferable to make a single direct measurement of the impulse response of a single device. Although the sampling oscilloscopes previously mentioned may be constructed with rise times as short as 25 picoseconds, pulse generators with similar speeds are not available. Furthermore, the problem of synchronizing the pulse generation and sampling functions limits the use of sampling oscilloscopes to time scales greater than approximately 50 picoseconds.

Recently, sampling systems having high resolution, less than 10 picoseconds, and capable of use with individual devices have been developed. See, for example, *Applied Physics Letters*, 36, pp. 1005-1007 and pp. 1008-1010, both dated June 15, 1980. These articles describe apparatus for measuring ultrashort current pulses with Josephson devices. While these sampling systems permit measurement of pulses having rise times as short as 10 picoseconds, they suffer the drawback of using superconducting devices which require immersion in liquid helium.

SUMMARY OF THE INVENTION

We have found that direct time domain measurements of the electronic impulse response of the electronic devices and materials may be made using optical pulses to drive photoconductors or optical-electronic devices to produce electrical pulses which interact in the electronic domain to yield information about the device or material. The apparatus comprises first and second means for generating electrical signals upon illumination by optical pulses, optical means for sequentially illuminating said first and second means; means for electrically connecting a device to said first and second means and an output terminal adaptable for connection to means for analyzing the output from said device. Although optical pulses are used to both generate and sample electrical events, the measurement technique is entirely electronic and does not require the optical illumination of the device or material being tested unless the device or material itself is photosensitive. In one embodiment, the first and second means comprise a pulse generator and a sampling gate. More than one pulse generator or sampling gate may be used either to obtain more detailed information or to characterize the device more rapidly. In another embodiment, nonlinear device response is obtained by using two pulse generators and analyzing the output as a function of the delay between the pulses.

The photoconductors are typically high speed devices made of amorphous or high defect density crystalline semiconductors.

The apparatus and method of this invention permit measurements of the electronic response of materials and devices with a time resolution less than 10 picoseconds.

DETAILED DESCRIPTION

Our invention will be illustrated by brief reference to several embodiments adapted for specific measurements and then by specific and detailed reference to apparatus suitable for the measurement of the electronic response time of a gallium arsenide field effect transistor. It is to be understood that our invention may be used to measure the response times of other devices, such as diodes, logic devices, microwave devices, and photosensitive devices. Although described with respect to a device, it is to be understood that in all embodiments a sample of bulk semiconducting material may be substituted and that the invention may further be used to measure the response times of semiconducting materials. Identical numerals represent identical elements in FIGS. 1-5.

Figure 1:
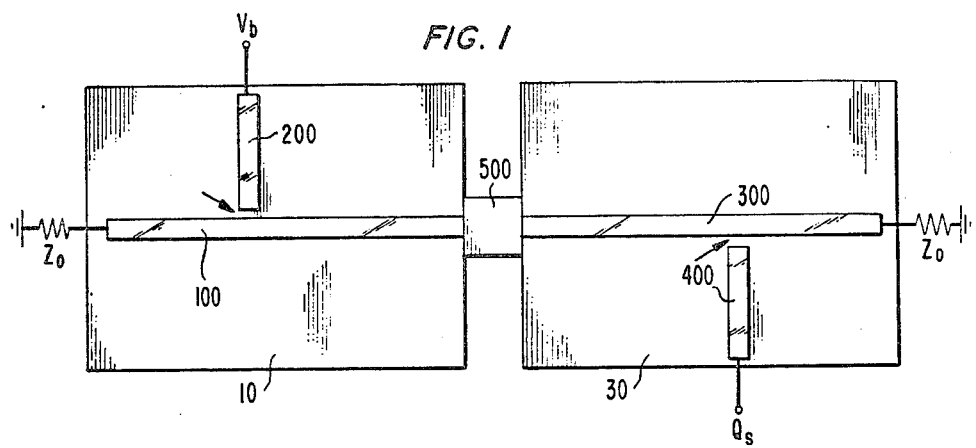
FIG. 1 is a schematic representation of apparatus of this invention having a pulse generator and a sampling gate.

FIG. 1 illustrates a pulse generator and sampling gate. For reasons of clarity in this and other FIGURES, the elements of the apparatus are not drawn to scale. Transmission lines 100 and 300 are disposed on substrates 10 and 30, respectively, and are connected to device 500 and terminating impedances $Z_o$. Transmission lines 200 and 400 are disposed on substrates 10 and 30, respectively, and are connected to bias voltage $V_b$ and output terminal $Q_S$, respectively. Transmission lines 200 and 400 are spaced from transmission lines 100 and 300, respectively, by gaps comprising photoconducting material. The gaps between transmission lines in FIGS. 2-5 also comprise photoconducting material. All transmission lines are disposed on substrates 10 or 30 as shown.

When the gap between transmission lines 100 and 200 is illustrated by an optical pulse which is indicated by the arrow, an electrical pulse is injected onto transmission line 100 and travels to device 500. The output pulse from device 500 is sampled at the output terminal by a delayed optical pulse which illuminates the gap between transmission lines 300 and 400 thus producing an electrical signal on transmission line 400. The total sampled charge, $Q_S$, is measured as a function of the delay time, $\tau$, between the optical pulses.

Figure 2:
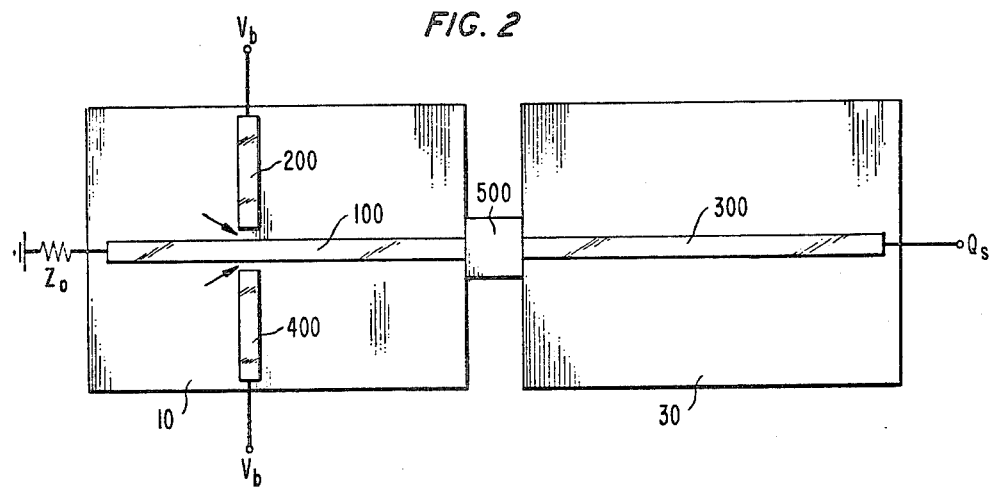
FIG. 2 is a schematic representation of apparatus of this invention for measuring nonlinear electronic correlation.

FIG. 2 illustrates an embodiment for nonlinear electronic correlation measurements. Transmission lines 200 and 400 are both biased with a dc voltage, $V_b$. The optical pulses illuminating the gaps between lines 100 and 200 and 400 have a relative delay time of $\tau$ between them so that two electrical pulses are produced separated by time $\tau$. These two electrical pulses are applied to the input terminal of device 500. The output signal is integrated, $Q_s(\tau)$, by apparatus connected to the output terminal as a function of the timing delay between the two optical pulses. If the first electrical pulse produces a nonlinear response in device 500, it will influence the response of the second pulse. By varying the relative delay between the two pulses, the recovery time of the nonlinearity can be measured.

Figure 3:
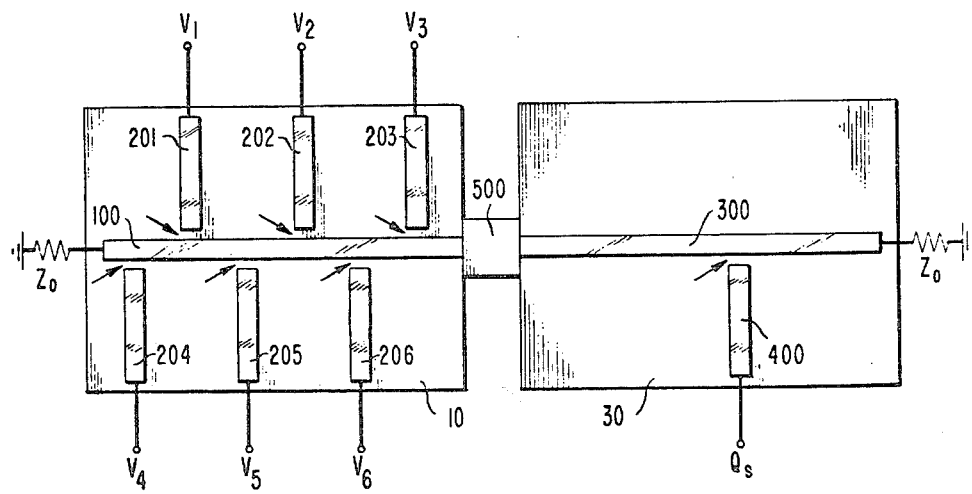
FIG. 3 is a schematic representation of apparatus of this invention having multiple pulse generators and a sampling gate.

FIG. 3 illustrates an embodiment having multiple pulse generators which serve as a waveform generator and a sampling gate. The pulse generators and sampling gates comprise the spaced transmission lines and the photoconducting material in the gap between the lines. The multiple pulse generators, i.e., inputs, are used to generate an arbitrary input waveform to the device by choice of the bias voltages applied to transmission lines 201, 202, 203, 204, 205 and 206, and the time delays for the optical pulses illuminating the gaps. For example, if alternately positive and negative bias voltages are applied to the transmission lines, a short burst of high frequency microwaves can be generated. The response of devices to this input signal can be measured by the sampling gate.

Figure 4:
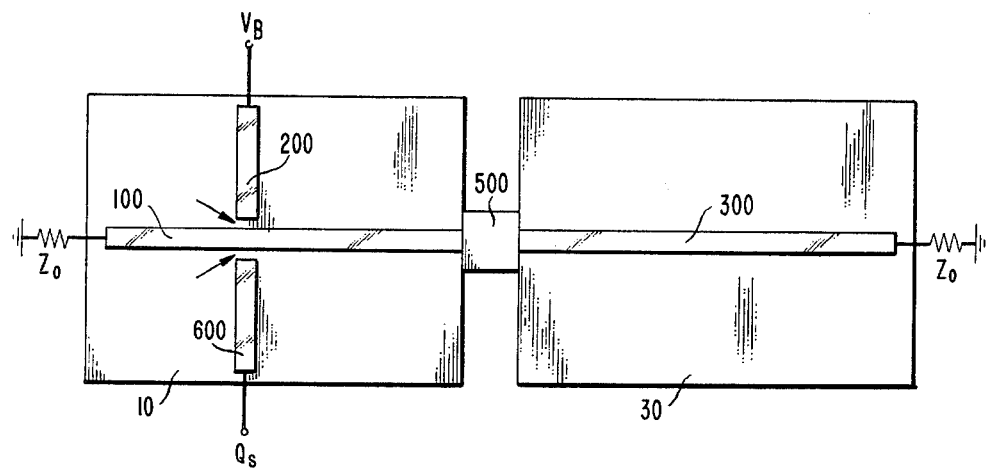
FIG. 4 is a schematic representation of apparatus of this invention for time domain reflectometry.

FIG. 4 illustrates apparatus for time domain reflectometry. Transmission line 200 has a dc bias voltage, $V_b$, and is part of the pulse generator. Transmission line 600, which is also on the input side of the device, is part of a sampling gate and is located directly opposite the transmission line 200. The sampling gate can sample the input pulse at zero time delay and then can sample the reflected waveform from the device.

Figure 5:
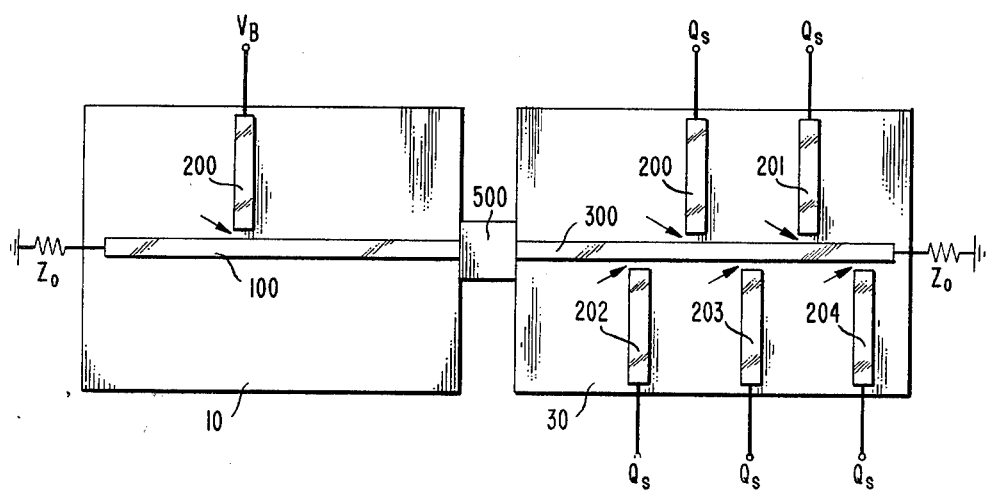
FIG. 5 is a schematic representation of apparatus of this invention having multiple sampling gates and a pulse generator.

FIG. 5 illustrates an embodiment for multiple sampling of the device output to obtain measurement by a single optical pulse. This embodiment has transmission lines 700, 701, 702, 703 and 704 and a plurality of sampling gates.

Figure 6:
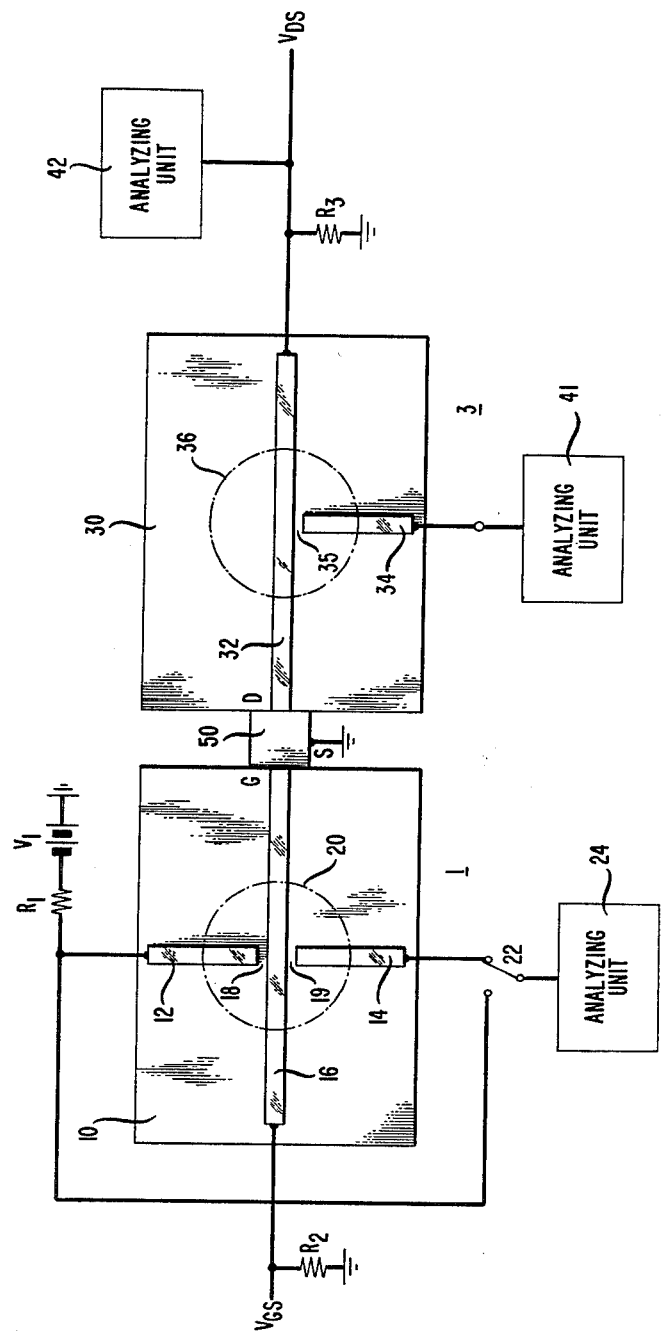
FIG. 6 is a schematic representation of apparatus of this invention for measuring the electronic response times of devices.

Several of the embodiments described with respect to FIGS. 1-5 may be combined as illustrated in FIG. 6. The device comprises pulse generating apparatus 1 and sampling gate apparatus 3. Disposed between and electrically connected to pulse generating apparatus 1 and sampling gate apparatus 3 is the electronic device or material 50 whose characteristics are to be measured. For the embodiment illustrated, electronic device 50 is a field effect transistor having gate, source and drain electrodes indicated as G, S, and D, respectively.

Pulse generating apparatus 1 comprises semiconductor layer 10 on which are disposed microstrip transmission lines 12, 14, and 16. Layer 10 is disposed on an insulating substrate 11. When the semiconductor is crystalline silicon, the substrate may be sapphire. When layer 10 comprises an amorphous semiconductor, the substrate may be any insulator, such as quartz, on which a semiconductor can be grown. As shown, there are gaps between transmission lines 12 and 16 and 14 and 16 indicated as 18 and 19, respectively. The material within the area indicated as 20 and thus within gaps 18 and 19 is amorphous or high defect density crystalline materials and forms the photoconductors. High defect density means greater than $10^{18}/cm^3$. Biasing one side of the photoconductor with voltage $V_1$ through $R_1$ permits the apparatus to act as a pulse generator.

Sampling gate apparatus 3 comprises semiconductor layer 30 and microstrip transmission lines 32 and 34 which, as indicated, are separated by gap 35. Layer 30 is disposed on substrate 31. Within the area indicated as 36 and thus within gap 35, which forms a photoconductor, the semiconductor is amorphous or high defect density crystalline material. Sampling gates are not externally biased as the electrical pulse being sampled provides the bias. The pulse generating apparatus and sampling gate apparatus comprise means for generating electrical signals upon illumination by an optical pulse.

The high defect density semiconductor material in all gaps leads to a very high speed photoconductor such as that described in *Applied Physics Letters*, 37, pp. 371-373, 1980. The term high defect density material as used in this application includes radiation damaged semiconductors. Of course, amorphous materials are also high defect density materials.

The external circuitry comprises voltage source $V_1$ which is connected to ground and to transmission line 12 through resistance $R_1$. Voltage source $V_{GS}$ and resistance $R_2$ are connected to transmission line 16. Switch 22 connects either input pulse measurement unit 24 or voltage source $V_1$ through resistance $R_1$ additionally to transmission line 14. The external circuitry further comprises output pulse sampling unit 41, output pulse correlation unit 42, voltage source $V_{DS}$, and resistance $R_3$ which is connected to ground. All output pulse units are connected to an output terminal and are indicated as analyzing units.

In the embodiment depicted, silicon-on-sapphire (SOS) wafers were used to form pulse generating apparatus 1 and sampling gate apparatus 3 and the area within circles 20 and 36 was radiation damaged silicon. The semiconductor material within these areas had a high defect density and was prepared by irradiation of an epitaxial silicon layer with 2 MeV argon ions at room temperature. This irradiation greatly increased the response speed of the photoconducting silicon layer by introducing a high density of trapping and recombination centers. The gaps in the microstrip transmission line structures in this high defect density material form the photoconductors, while the microstrip transmission lines provided the electrical interconnection between the pulse generator, sampling gate, field effect transistor, and the external circuitry. Similar structures can, of course, be used to construct the embodiments depicted in FIGS. 1-5.

Pulse generating apparatus 1 may be used to measure the response time of the semiconductor material comprising layer 10. In this embodiment of our invention, both the pulse generator and the sampling gate are on the same side of device 50 as shown in FIG. 2. The output may then be analyzed within input pulse measurement unit 24.

Figure 7:
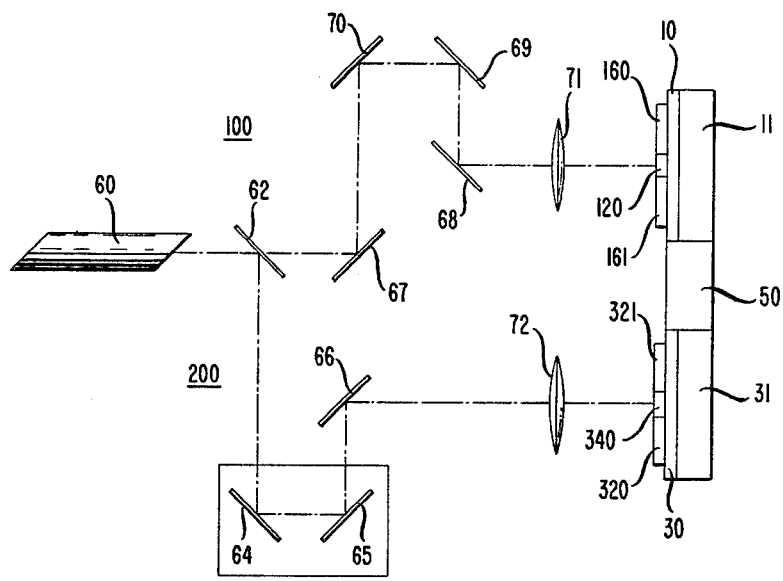
FIG. 7 is another schematic representation of apparatus of invention.

FIG. 7 is another schematic representation of the apparatus. The photoconductors are illuminated by a laser 60, such as a mode-locked rhodamine 6G dye laser which is synchronously pumped by a mode-locked argon ion laser. Other lasers or sources of illumination may, of course, be used. The optical beam is conveniently split into two beams of approximate equal intensity by a beam splitter 62. The required beam intensity can be easily ascertained by those skilled in the art. The first beam, indicated generally as 100, has a fixed path length formed by mirrors 67, 68, 69 and 70, and the second beam, indicated generally as 200, has a variable path length formed by mirrors 64, 65, and 66. Variable delay is conveniently provided by mounting mirrors 64 and 65 on a translation stage 211 with a known, for example, 2 micron, step size. The difference in variable path lengths permits the arrival times of the beams at pulse generating apparatus 1 and sampling gate apparatus 3 to be varied with respect to each other. As shown, layers 10 and 30 are disposed on substrates 11 and 31, respectively. The two optical beams are focused on gaps 120 and 340 formed between lines 160 and 161, and 320 and 321, respectively, by lenses 71 and 72, respectively. If the beams are sufficiently intense, lenses 71 and 72 are not necessary.

Modifications of the apparatus depicted in FIG. 7 are possible. For example, beam 100 may pass directly from beam splitter 62 to lens 71 and then to gap 120. Also, both beams may be focused on the same semiconductor layer. This will be done when the characteristics of the semiconductor layer are being measured.

The microstrip transmission line on one side of the photoconductor is DC biased when a pulse generator is desired. Illumination of the gap by the optical pulse permits a quantity of charge to be injected onto the microstrip transmission line where it propagates as a pulse. When a sampling gate is desired, the propagating pulse which is being sampled provides the bias.

Upon illumination of gap 35 in FIG. 6 at the appropriate time, charge may be coupled from the propagating pulse to a second microstrip transmission line, e.g., line 34. Varying the arrival time of the optical pulse at the sampling gate relative to the arrival time of the propagating electrical pulse permits sampling of the electrical pulse as a function of the time delay between the optical pulses at the generating and sampling gates. It should be noted that with this technique, both optical beams originate from the source 60 and the resulting measurements are jitter free. The generating and sampling functions are perfectly synchronized.

Microstrip transmission lines 16 and 32 are connected to the gate and drain electrodes of the device which is a field effect transistor and form the main section of the measurement circuit. The sections of the transmission lines perpendicular to the main line form the photoconductor biasing and sampling sections of the circuit. Thus, the electrical pulses used to measure the field effect transistor are injected onto, or extracted from, the main transmission lines 16 and 32. Device 50 biasing is easily achieved by connecting the gate and drain voltages to the respective sections of the main microstrip transmission lines 16 and 32 as shown. These external connections for biasing should be placed far enough away from the device so that reflections from these connections do not interfere with the pulse response measurements. Additionally, resistances R2 and R3, typically 50 ohm resistances, may be present in the external circuitry to limit the reflections.

Electrical pulses were applied to the gate electrode by applying a DC bias to the side microstrip transmission line 12 and illuminating gap 18.

Switch 22 may be connected to either input pulse measurement unit 24 or to bias voltage $V_1$ resistance $R_1$. When connected to input pulse measurement unit 24, the electrical pulses generated by illuminating the gap 18 between lines 12 and 16 may be measured by illuminating the gap 19 between lines 14 and 16. Analyzing unit 24 which is a measurement unit permits observation of the generated pulse and its reflection from the gate electrode. Comparison of these pulses yields information about the device input impedance.

Several types of measurements of device characteristics may be made with the apparatus depicted in FIG. 6. For example, a throughput measurement to obtain the linear impulse response of the FET may be made by generating an electrical pulse at gap 18 and sampling the FET output with the sampling gate apparatus 3 and analyzing the output with analyzing unit 41 which is a pulse sampling unit. In this case, the input pulse is injected onto the main microstrip transmission line at pulse generator 18 and the output pulse is sampled at gap 35. Analyzing unit 41 which is a pulse sampling unit may comprise an integrator and lock-in amplifier as well as a multichannel analyzer.

Figure 8:
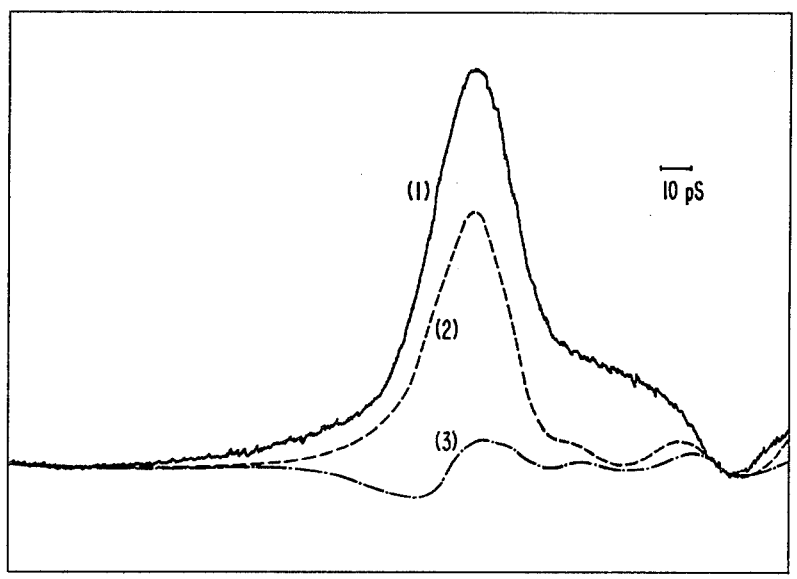
FIG. 8 shows the electronic response, as a function of time, of a gallium arsenide FET measured using the apparatus depicted in FIG. 1.

The results of measurements on a GaAs FET are shown in FIG. 8 for different bias conditions. Curve 1 was made with $V_{GS}=-1.05$ volts and $V_{DS}=0.9$ volts and curve 2 was made with $V_{GS}=-1.05$ volts and $V_{DS}=0$. Curve 3 was made with the 8 GaAs FET replaced by a 50 ohm coaxial cable. The short horizontal line represents 10 picoseconds.

Several features are evident in FIG. 8. Curve 3 shows that the circuit response of the system has a width of 33 ps full width half maximum (FWHM). Since this measurement consisted of a convolution of generating and sampling circuits, the actual electrical pulse was shorter, and can be estimated for an analysis of the photoconductor circuits to be approximately 25 psec at the sampling gate as compared to 15 psec at the generator. The pulse broadening was due primarily to dispersion in the microstrip transmission lines. When biased for maximum gain, curve 1, the FET produced a new voltage gain of 3.7 db over the circuit response. The device response has a fast component which follows the input pulse with minimal broadening, and a slow component evidenced during the falling edge. The fast component has a FWHM of 40 ps. Substrating the circuit response by sum of the squares results in a device response time of approximately 23 psec FWHM. The slow component in the falling edge lengthens the pulse by some 60 psec, resulting in a fall time of 75 psec. Under a zero drain current bias condition, the linear response of the FET shows that the input and output are capacitively coupled. The value of this gate to drain capacitance can be estimated from the relative amplitudes of the zero drain current response, and circuit response to be approximately 0.012 pF which is in good agreement with circuit models of a GaAs FET.

The nonlinear response of the FET may be measured by generating electrical pulses in gaps 18 and 19 and directly measuring the output on the drain microstrip transmission line in output correlation unit 42. Unit 42 performs a background subtraction to eliminate $V_{DS}$. For this measurement, switch 22 must connect transmission line 14 to resistance $R_1$. If the output is directly integrated, the linear portion of the response is observed as a constant value while the cross terms due to the nonlinearity are observed as a correlation function of the delay between the two input pulses. The first pulse alters the device characteristics and the second pulse permits measurement of the device recovery time from the first pulse.

It should be emphasized that units 24, 41 and 42 are not high speed devices. It should also be emphasized that there is no need to transmit high speed signals over long distances.

Other embodiments are easily thought of. For example, device 50 might be an optical electronic device such as a photosensitive FET and it might be illuminated by beam 100. Further, device 50 might simply be a sample of bulk semiconductor material. Additionally, although described with respect to measurement of high speed devices, the invention may be used with slower devices where its jitter free operation of pulse generator and sampling gate is advantageous. It may also be used to measure a very small time difference between two relatively slow events. Moreover, the pulse generators and sampling gate may be fabricated on the same substrate. This substrate may further contain an integrated circuit 50 fabricated on the substrate. The pulse generator and sampling gate thus permit evaluation of the integrated circuit response as the integrated circuit output terminals are connected to the analyzing units. For this application, as well as for others, device means any element having input and output terminals. The term thus includes discrete devices as well as integrated circuits.

What is claimed is:

1. Apparatus for measuring electronic response times comprising:
    a first and second means for generating electrical signals upon illumination by optical pulses, said first and second means comprising a pulse generator and a sampling gate, respectively;
    optical means for sequentially illuminating said first and said second means;
    means for electrically connecting a device to said first and said second means; and
    an output terminal adaptable for connection to means for analyzing the output from said device.

2. Apparatus as recited in claim 1 in which said first means comprises a photoconducting pulse generator.

3. Apparatus as recited in claim 1 or 2 in which said second means comprises a photoconducting sampling gate.

4. Apparatus as recited in claim 3 in which said sampling gate comprises a high defect density semiconductor.

5. Apparatus as recited in claim 3 in which said pulse generator comprises high defect density semiconductor.

6. Apparatus as recited in claim 5 in which said first means further comprises at least a second pulse generator.

7. Apparatus as recited in claim 5 in which said second means further comprises at least a second sampling gate.

8. Method for measuring electronic response times comprising the steps of:
    connecting electrically an electronic device to first and second means for generating electrical signals when said first and said second means are illuminated by optical pulses, said first and second means comprising a pulse generator and a sampling gate, respectively;
    sequentially illuminating said first and said second means; and
    analyzing the output from said device.

9. A method as recited in claim 8 in which said first means comprises a pulse generator.

10. A method as recited in claim 9 in which said second means comprises a photoconducting sampling gate.

11. A method as recited in claim 9 further comprising at least a second pulse generator.

12. A method as recited in claim 10 further comprising at least a second pulse generator.

13. A method as recited in claim 10 in which said photoconducting sampling gate comprises a high defect density semiconductor.

* * * * *